April 27, 1965 B. E. ATTWOOD 3,181,084

TEMPERATURE COMPENSATED TRANSISTOR RELAXATION OSCILLATOR

Filed Feb. 9, 1962

INVENTOR
BRIAN E. ATTWOOD

BY [signature]
AGENT

United States Patent Office 3,181,084

Patented Apr. 27, 1965

3,181,084

TEMPERATURE COMPENSATED TRANSISTOR RELAXATION OSCILLATOR

Brian Ernest Attwood, Burstow, near Horley, England, assignor to North American Philips Company, Inc., New York, N.Y., a corporation of Delaware Filed Feb. 9, 1962, Ser. No. 173,322
Claims priority, application Great Britain, Mar. 2, 1961, 7,649/61
3 Claims. (Cl. 331—109)

This invention relates to a relaxation oscillator circuit including a timing capacitance, means for charging said capacitance from a source of D.C. power-supply voltage and at least one transistor for discharging said capacitance.

Compensation for increase in the leakage current ($I_{co}$) of transistors by means of thermistors to prevent so-called thermal runaway is well known in circuits other than oscillator circuits.

Normal compensation for $I_{co}$ changes involves the use of a negative-temperature-coefficient (NTC) resistor in the base circuit or a positive-temperature-coefficient (PTC) resistor in the emitter circuit.

A typical transistor amplifier circuit is shown in FIGURE 1 of the accompanying drawings. With increasing temperature, $I_{co}$ increases and makes point A more negative, since more collector current is flowing. (With certain limitations, this effect can be simulated by placing a resistor R1′ across resistor R1.) For compensation the operation is such that, with increasing temperature, the value of an NTC resistor R2 falls and the base-emitter voltage ($Vbe$) decreases thereby offsetting the rise in collector current. In the case of a PTC resistor at R3 in place of the NTC resistor R2 the resistance value increases thus again reducing $Vbe$.

Such compensating means are not used for oscillator circuits since (as will be explained more fully) they are liable to render the frequency stability worse (with reference to temperature changes) than it is in the absence of such temperature compensating means. Moreover, the teaching in this art has been dominated by the idea that the frequency instability should be tackled at its source by preventing the current changes due to the temperature dependence of $I_{co}$.

The relaxation oscillator circuit according to the present invention is characterized in that it further includes a negative-coefficient temperature-dependent resistance connected in series in the emitter circuit of said transistor and increasing the temperature-dependence of the emitter and collector-current of the transistor, whereby the voltage swing and the discharge rate of said capacitance increase with temperature to such extents that the discharge time of the timing capacitance remains substantially unaltered by changes of temperature.

Such a circuit operates in such a manner that it actually takes advantage of the increased temperature dependence of the emitter and collector current in order to obtain stability of the relaxation frequency.

Preferably, the base circuit of the transistor includes a first inductance inductively regeneratively coupled to a second inductance arranged in the collector circuit of the transistor.

The invention will now be described in further detail with reference to the accompanying drawings, wherein.

Figures 2, 3:
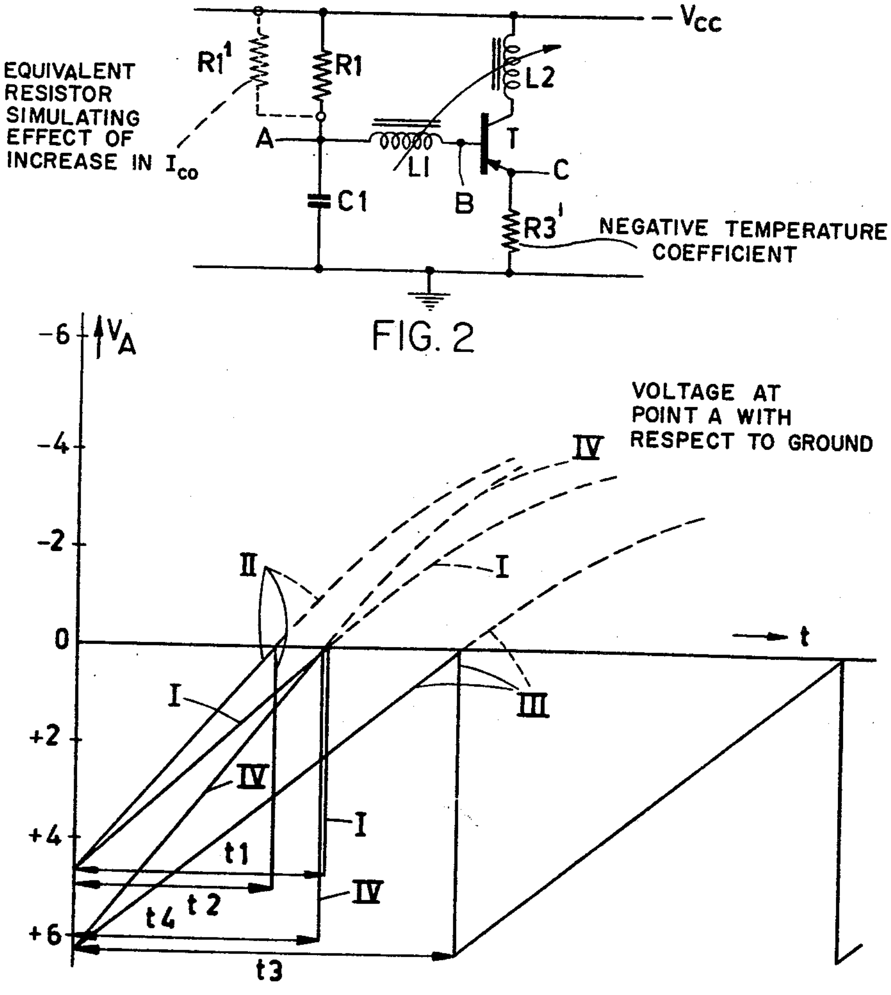
FIG. 2 is the circuit diagram of a preferred embodiment of the relaxation oscillator circuit according to the present invention.
FIG. 3 shows voltage-time diagrams illustrating the operation of this relaxation oscillator circuit.

The embodiment shown in FIG. 2 is a base-timed blocking oscillator employing a pnp-junction transistor T with first and second inductances L1 and L2. This circuit has a timing capacitance C1 connected in series with a resistance R1 across the emitter-collector D.C. supply terminals of the circuit, the junction between said resistance and the timing capacitance being connected to the end of the base inductance L1 remote from the base while said capacitance is connected between the base inductance and the grounded terminal of the emitter D.C. supply.

The collector circuit of the transistor T includes the second inductance L2, which is inductively and regeneratively coupled with the first inductance L1, and its emitter circuit includes a resistor R3′.

The blocking oscillator of FIG. 2 operates as follows: When the supply voltage is initially applied, the base is forward biased due to the negative voltage applied to the base by way of R1 and inductance L1. The transistor thus conducts, with base current flowing in the path R3′, the transistor emitter-base path, inductance L1, and resistor R1, and collector current flowing in the path R3′, the transistor collector-emitter path, and inductance L2. Due to the regenerative action of the transformer, the transistor is rapidly saturated, and the current in the inductance then increases linearly with time, with the collector voltage being fixed. The base current then begins to decrease, and when this current has dropped sufficiently, the transistor becomes unsaturated, the drop in collector voltage is regeneratively coupled to the base by way of the transformer, and the transistor is cut off. During the conduction period of the transistor, the capacitor C1 is charged positively by way of inductance L1, the emitter-base path of the transistor, and R3′, due to the constant voltage across inductance L1, so that at the end of the conduction period the point A is positive with respect to the emitter and ground. The positive voltage on C1 holds the transistor cut off until the capacitor has discharged sufficiently, by way of R1, that the transistor again becomes forward biased.

Figure 1:
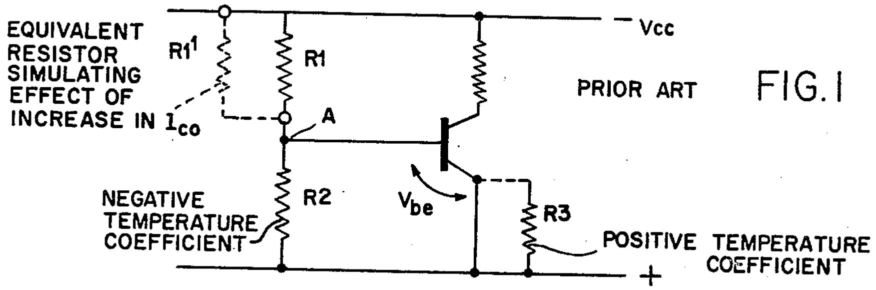
FIG. 1 is the circuit diagram of a transistor-amplifier stage, showing two alternative methods of temperature compensation.

Assuming first that R3′ is not temperature-dependent, the circuit of FIG. 2, will operate in such manner that, as the temperature rises, $I_{co}$ increases thereby again effectively shunting R1 by R1′. This results in a shorter discharge time constant for C1 in the base circuit of the transistor, so that the sawtooth relaxation frequency thus increases with temperature. Conventional means of compensation such as those of FIG. 1 would be actually harmful with regard to frequency stability as will be explained:

(*a*) An NTC resistance in the base across C1 would reduce the time constant with temperature and, again, the frequency would increase.

(*b*) A PTC resistance in the emitter lead would also increase frequency for the following reason.

Point A is positive with respect to B during the stroke of the sawtooth. Now if R3′ increases, point C (and thus point B) becomes more negative and, since the voltage across L1 is substantially constant, point A also goes slightly more negative. This is in effect the same as connecting an additional resistor across R1′ or reducing the value of R1′ and R1 thus making the frequency higher still. Thus a PTC resistor in the emitter lead actually aids $I_{co}$ in making frequency stability worse although it does counteract the increase in peak collector current as in a conventional temperature-compensated circuit.

If, now, an NTC resistor is used as R3′ in accordance with the invention, then value R3′ decreases with temperature, point C becomes more positive, and points B and A also become more positive. Then C1 starts discharging from a more positive potential so that the period of oscillation becomes longer. This action can be shown in more detail with reference to the curves of FIG. 3. In other words, since the positive potential at point A is greater, the drop across the capacitor is increased, and it will take longer for the capacitor to discharge to the potential at which the transistor conducts..

Curve I of FIG. 3 shows the discharge characteristic of C1 under normal conditions, for example 25° C. with an R3′ value of, say 2Ω. The period of oscillation is given by the discharge time *t*1. With increasing temperature, $I_{co}$ increases thus effectively shunting R1 by R1′ and giving a faster discharge time for the same uncompensated circuit. This is shown by curve II and time *t*2.

If the emitter resistor R3′ is reduced from 2Ω (e.g. to zero value) but no temperature increase has occurred, i.e. still at 25° C., then curve III and period *t*3 are obtained (with an increased positive swing), since, with the constant voltage drop across L1 and the emitter being at ground potential , the voltage at point A will be more positive. If now the temperature is increased (this condition corresponds to the practical NTC case at a high temperature, i.e. reduced value of R3′ but increased $I_{co}$) curve IV and period *t*4 is obtained. Period *t*4 can be made the same as period *t*1 by a correct choice of NTC resistor, and thus the frequency can be maintained substantially constant with temperature.

Although frequency has thus been maintained substantially constant, the collector current will have increased slightly with $I_{co}$. This, however is not dangerous in the blocking oscillator circuit since the components rather than the transistor fix the peak current. Thus thermal runaway will not occur.

Changes in the base-emitter voltage V*be* have been ignored (this reduces in the present case by about 2M V./° C.). In fact they tend to reduce frequency drift, so that any actual frequency drift occurring will be all due to $I_{co}$.

The circuit shown in FIG. 2 is particularly suitable for use in a transistorized field time-base for a television receiver or the like. In fact, the very low frequency required (e.g. 50 c./s.) can readily be obtained with very small timing components and an NTC resistor of very small value as currently available. A practical set of values and components for this particular application is given below by way of illustration:

*Table*

| | |
|---|---|
| Transistor T | Mullard type OC84. |
| Collector supply $V_{cc}$ | 12 volts. |
| Resistor R1 | 18 KΩ. |
| Resistor R3′ | 2Ω at room temperature. |
| Capacitor C1 | 2 μf. |
| Winding L1 | 660 turns. |
| Winding L2 | 1320 turns. |

What is claimed:

1. A relaxation oscillator comprising a junction transistor having emitter, base and collector electrodes, a source of operating potential having first and second terminals, a timing capacitor and a resistor serially connected in that order between said first and second terminals, means connecting the base-emitter path of said transistor in parallel with said capacitor, means connecting said collector electrode to said second terminal, and feedback means regeneratively coupling at least two of said electrodes, said means connecting said base-emitter path in parallel with said capacitor comprising temperature dependent resistor means having a negative temperature coefficient connected in series with said emitter electrode, whereby the discharge time of said timing capacitor is substantially unaffected by thermal variation of the parameters of said transistor.

2. A relaxation oscillator comprising a junction transistor having emitter, base and collector electrodes, a source of operating potential having first and second terminals, a capacitor and resistor connected serially in that order between said first and second terminals, a transformer having first and second windings, means connecting said first winding between said base electrode and the junction of said capacitor and resistor, means connecting said second winding between said collector electrode and said second terminal, and negative temperature coefficient resistor means connected between said emitter electrode and first terminal.

3. A relaxation oscillator comprising a junction transistor having emitter, base and collector electrodes, a source of operating potential having first and second terminals, a timing capacitor, discharge resistor means, means connecting said resistor means to said capacitor for discharging said capacitor, means connecting an end of said capacitor to said first terminal, means connecting the base-emitter path of said transistor in parallel with said capacitor, means connecting said collector electrode to said second terminal, and feedback means regeneratively coupling at least two of said electrodes, said means connecting said base-emitter path in parallel with said capacitor comprising temperature dependent resistor means having a negative temperature coefficient connected in series with said emitter electrode, whereby the discharge time of said timing capacitor is substantially unaffected by thermal variation of the parameters of said transistor.

References Cited by the Examiner

UNITED STATES PATENTS

| | | | |
|---|---|---|---|
| 2,791,693 | 5/57 | Moore | 331—109 |
| 3,051,944 | 8/62 | Smith | 331—112 X |

ROY LAKE, *Primary Examiner.*

JOHN KOMINSKI, *Examiner.*